(12) United States Patent
Penka et al.

(10) Patent No.: US 7,482,288 B2
(45) Date of Patent: Jan. 27, 2009

(54) METHOD FOR PRODUCING A GRID CAP WITH A LOCALLY INCREASED DIELECTRIC CONSTANT

(75) Inventors: Sabine Penka, Unterhaching (DE); Armin Fischer, München (DE)

(73) Assignee: Infineon Technologies AG, Munich (DE)

( * ) Notice: Subject to any disclaimer, the term of this patent is extended or adjusted under 35 U.S.C. 154(b) by 343 days.

(21) Appl. No.: 11/454,468

(22) Filed: Jun. 16, 2006

(65) Prior Publication Data

US 2007/0145544 A1  Jun. 28, 2007

Related U.S. Application Data

(63) Continuation of application No. PCT/DE2004/002794, filed on Dec. 21, 2004.

(30) Foreign Application Priority Data

Dec. 23, 2003  (DE) .................. 2003010360933

(51) Int. Cl.
 *H01L 21/00* (2006.01)
(52) U.S. Cl. ....................... 438/798; 438/795
(58) Field of Classification Search .............. 438/795, 438/798
 See application file for complete search history.

(56) References Cited

U.S. PATENT DOCUMENTS 6,436,808 B1 * 8/2002 Ngo et al. ............... 438/623
6,459,562 B1 10/2002 KarRoy et al.
6,921,727 B2 * 7/2005 Chiang et al. ............. 438/778
2002/0016085 A1 2/2002 Huang et al.
2003/0107465 A1 6/2003 Hiraoka et al.
2003/0201465 A1 * 10/2003 Ryuzaki et al. ............. 257/200
2003/0232495 A1 12/2003 Moghadam et al.

FOREIGN PATENT DOCUMENTS

DE        28 23 881 B2    6/1981

(Continued)

OTHER PUBLICATIONS

The effects of plasma treatment of low dielectric constant hydrogen silsesquioxane (HSQ), P.T. Liu, et al., Thin Solid Films 332 (1998), pp. 345-350.

(Continued)

*Primary Examiner*—Bradley K Smith
(74) *Attorney, Agent, or Firm*—Brinks Hofer Gilson & Lione

(57) ABSTRACT

A method for producing a semiconductor product. Semiconductor product components are formed in a semiconductor product region of the substrate. A layer made of low-k material is subsequently formed on the substrate. Electrically conductive interconnects are formed in and/or on the layer made of low-k material. The layer of low-k material is provided in a wiring plane of the semiconductor product region for the electrical insulation of the interconnects from one another. A grid cap region of the substrate is subjected to a spacially delimited treatment such that the value of the dielectric constant is increased in the crossover region. Accordingly, an interconnect to interconnect capacitance is formed as grid cap capacitance from the interconnects arranged in the crossover region and the material and increased value of dielectric constant. Further, the dielectric constant of the low-k material remains unchanged in the semiconductor product region.

15 Claims, 3 Drawing Sheets

FOREIGN PATENT DOCUMENTS

EP  1 195 801 A2  4/2002
WO  WO 03/015150 A1  2/2003

OTHER PUBLICATIONS

Effects of $NH_3$-Plasma Nitridation on the Electrical Characterizations of Low-$k$ Hydrogen Silsesquioxane with Copper Interconnects, P.T. Liu, et al., IEEE Transactions on Electron Devices, vol. 47, No. 9, Sep. 2000, pp. 1733-1739.

$O_2$-Plasma Degradation of Low-$K$ Organic Dielectric and Its Effective Solution for Damascene Trenches, C.F. Yeh, et al., 2000 5th International Symposium on Plasma-Induced Damage, May 23-24, pp. 81-84.

Porous low k pore sealing process study for 65 nm and below technologies, T. Mourier, et al.

* cited by examiner

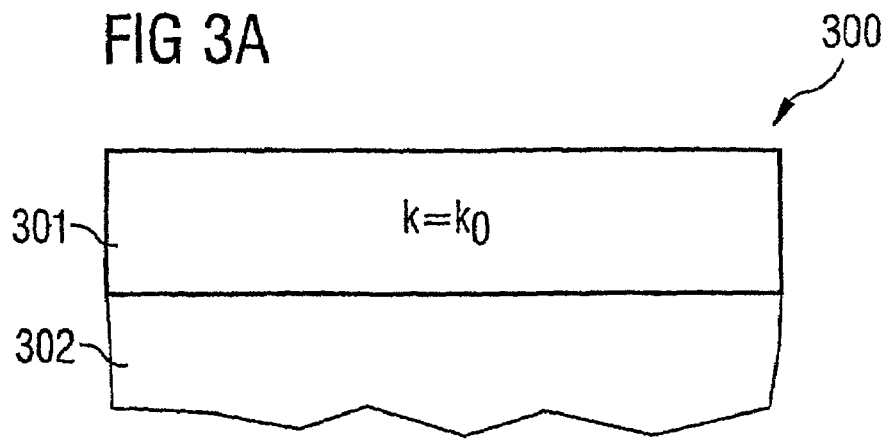
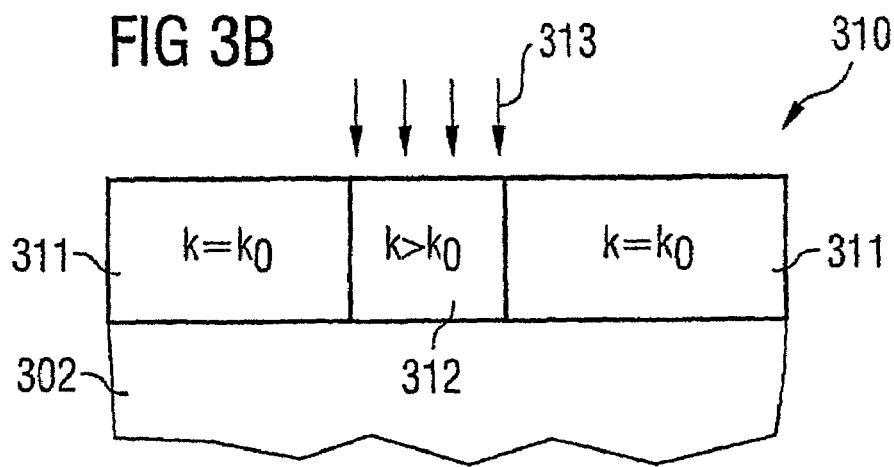
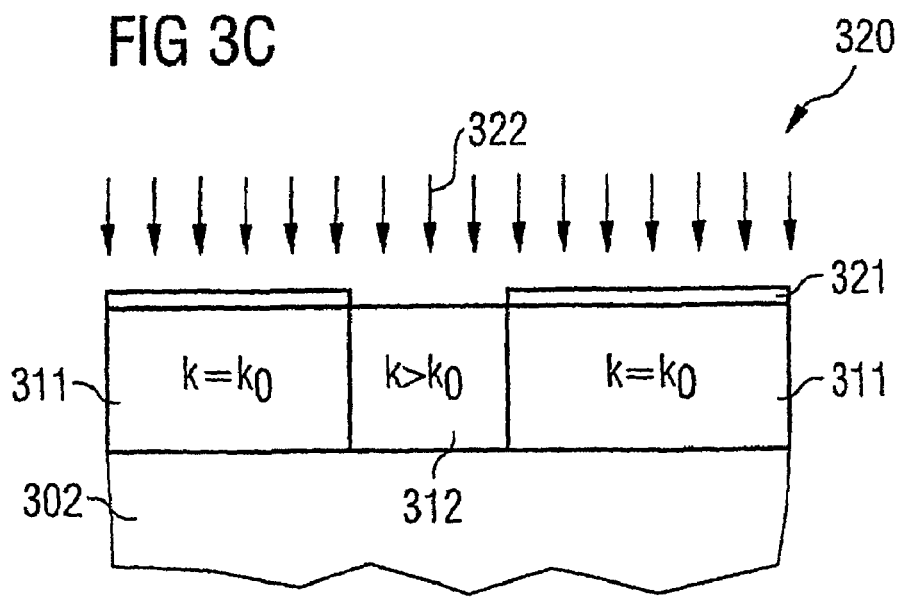

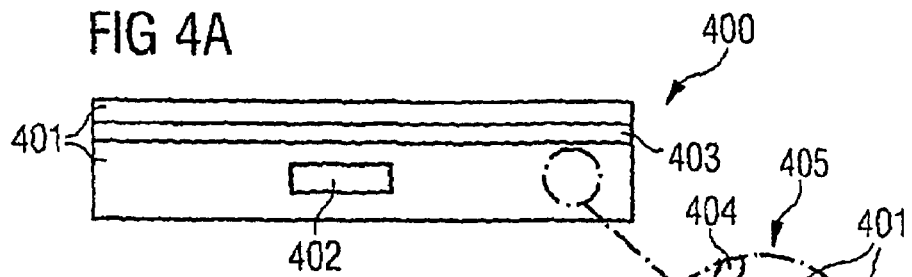
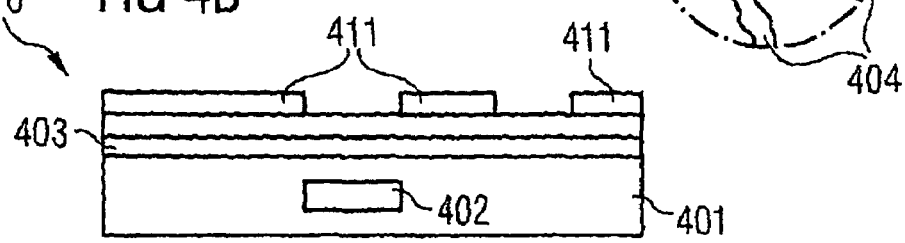
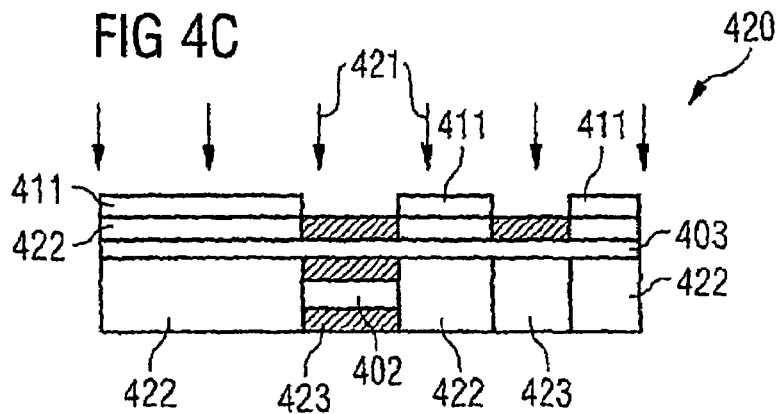
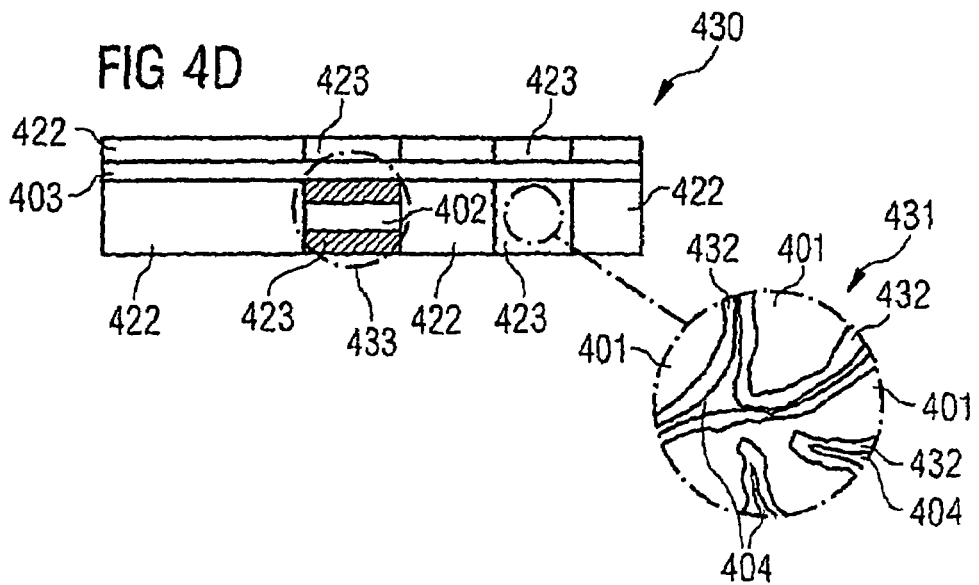

METHOD FOR PRODUCING A GRID CAP WITH A LOCALLY INCREASED DIELECTRIC CONSTANT

CROSS-REFERENCE TO RELATED APPLICATIONS

This application is a continuation of international application PCT/DE2004/002794 filed Dec. 21, 2004, which claims priority to German Patent Application No. DE 10360933.4 filed Dec. 23, 2003, both of which are incorporated in their entirety by reference herein.

FIELD OF THE INVENTION

The invention relates to a method for producing a semiconductor product.

SUMMARY

In semiconductor technology, in particular when forming integrated circuits, electrically insulating layers are required for many applications. If insulation layers are formed in an integrated circuit which also contains electrically conductive regions, in particular interconnects, then a coupling capacitance occurs from adjacent interconnects and the dielectric layer arranged in between. Given a relative permittivity (dielectric constant) $\in$ of the dielectric layer, the capacitance of two parallel conductor tracks whose opposite areas A are arranged at a distance d from one another results as $$C = \in A/d \tag{1}$$

With advancing miniaturization of silicon microelectronics, that is to say as the distance d between adjacent conductor tracks decreases, a large coupling capacitance C results particularly when the adjacent areas A of the conductor tracks are large, that is to say that the conductor tracks run parallel to one another over a large length region in the integrated circuit.

Problems with coupling capacitances thus increase with advancing miniaturization of an integrated circuit. The propagation time of a signal in an interconnect increases as the coupling capacitance increases because said propagation time is determined by the product of nonreactive resistance R and capacitance C (so-called "RC delay"). Furthermore, a crosstalk between signals on different conductor tracks becomes ever greater with the realization of an increasing number of increasingly miniaturized planes of integrated semiconductor components and leads to considerable delay times or attenuations of such signals.

As can be seen from equation (1), with predetermined structure dimensions A, d, a reduction of a coupling capacitance C is possible if the relative permittivity $\in$ of the insulating material is reduced. It is therefore attempted to use materials for insulation layers in integrated circuits layers having a low relative permittivity $\in$ (so-called "low-k materials").

Particularly in processing planes of semiconductor products that are situated at a higher level, conductor tracks are embedded in low-k material in order to reduce the coupling capacitances between the conductor tracks.

On the other hand, also in regions comprising low-k layers, passive components such as nonreactive resistances, inductances or capacitances are important platform constituents, in particular for realizing mixed-mode applications. This also applies to applications which represent a mixture of different circuit technologies (e.g. analog and digital circuit technology subcircuits in different regions of an integrated circuit product). In other words, components of this type, in particular capacitances, are also required in such processing planes.

In the "Front End Of the Line" (FEOL), capacitances are realized using so-called N caps in accordance with the prior art. So-called MIM caps (metal-insulator-metal) are used in the "Back End Of the Line" (BEOL). An MIM cap is a dielectric layer embedded between two metallic capacitor electrodes. For an MIM cap, a dedicated dielectric (for example silicon nitride, $Si_3N_4$, or aluminum oxide, $Al_2O_3$) is required as a special additional device and additional mask planes and processing steps are furthermore required. This is complicated and leads to expensive processing.

Another realization of BEOL capacitances is constituted by the so-called grid caps, cage caps or sandwich caps (hereinafter referred to in combination as grid caps), in the case of which the two electrodes of the capacitor are formed from the metal wiring that is provided anyway and in the case of which the dielectric is formed from the inter- and/or intrametal insulation layers. Special materials mask planes or process steps are obviated in this case.

Driven by the requirement to reduce the RC delay and the crosstalk, in future technology generations in accordance with the IRTS Roadmap there will be a progressive reduction of the k value in the Back End Of the Line on account of the use of low-k materials. With a reduction of the k value of such dielectric layers, although the problem with undesirable coupling capacitances between metallization planes can be reduced, at the same time the capacitances of the grid caps also decrease in an undesirable manner. For future technology generations it is highly questionable whether a sufficient high capacitance will still be achievable with the grid caps in order to form passive components such as integrated capacitors.

When using a material having a reduced k value, it is necessary to increase the total length and thus the chip area to be taken up for grid cap wirings in order to realize the same capacitance value. The maximum achievable capacitance is no longer sufficient for many applications, so that grid caps can no longer be used for many applications in future technology generations. It is then necessary to resort to MIM caps or N caps, which have the disadvantages described above.

The problem described above is explained in more detail, referring to FIG. 1.

FIG. 1 shows a plan view of a semiconductor product 100 having a product section 101 and a grid cap section 102. In the product section 101 product components 104 are embedded in a dielectric low-k layer 103 having a k value $k=k_0$. Furthermore, metallization components 105 are embedded in the dielectric low-k layer 103 in the grid cap section 102, the value of the k value being $k=k_0$ in the grid cap section 102 as well. With decreasing k values, although the problems in the product section 101 with undesirable parasitic coupling capacitances decrease, at the same time the problems in the grid cap section 102 increase since, in accordance with equation (1), the desirable capacitances between metallization components 105 decrease in an undesirable manner.

The invention is based on the problem, in particular, of providing a possibility which enables sufficiently large capacitances to be provided as passive components in a layer made of low-k material even in future technology generations.

The problem is solved by means of a method for producing a capacitance in a layer made of low-k material having the features in accordance with the independent patent claim.

In accordance with the method according to the invention for producing a capacitance in a layer made of low-k material, a layer made of low-k material is formed, electrically conductive structures are formed in and/or on the layer made of low-k material and the layer made of low-k material, at least in a crossover region of electrically conductive structures, is subjected to a spatially delimited treatment such that the value of the dielectric constant is increased in the crossover region, whereby a capacitance is formed from the electrically conductive structures in the crossover region and the material having the increased value of the dielectric constant.

In a method for producing a semiconductor product, semiconductor product component, for example transistors, that is to say nonreactive resistances, diodes, capacitances, etc., are formed in a semiconductor product region of a substrate. Afterward, a layer made of low-k material is formed above the substrate and electrically conductive conductor tracks are formed in and/or on the layer made of low-k material for the purpose of electrically connecting the semiconductor product components, the layer being provided in a wiring plane of the semiconductor product for the electrical insulation of the conductor tracks from one another. Subsequently, in a grid cap region of the substrate, situated outside the semiconductor product region, and thus outside the region in which the semiconductor product component are arranged, the layer made of low-k material, in at least one crossover region of the conductor tracks, is subjected to a spatially separate treatment such that the value of the dielectric constant is increased in the crossover region, whereby an conductor track-to-conductor track capacitance is formed as a grid cap capacitance from the interconnects arranged in the crossover region and the material having the increased value of the dielectric constant. The dielectric constant of the low-k material in the semiconductor product region remains unchanged, that is to say unprocessed, in this case.

One aspect of the invention is based on providing, in a layer made of low-k material in spatially delimited regions, that is to say in a locally defined manner, sections having an increased k value in a low-k layer. Such spatially delimited regions are preferably selected in such a way that they constitute crossover regions between adjacent electrically conductive structures (e.g. conductor tracks), so that the coupling capacitance thereof can concomitantly be used as a passive component, that is to say as a capacitance.

Consequently, another aspect of the invention makes it possible to keep down undesirable coupling capacitances in the majority of the layer made of low-k material, thereby to avoid an undesirable crosstalk between signals on different conductor tracks and also to keep down the RC delay, and at the same time to provide locally delimited regions made of material having an increased k value, so that these regions can be used together with surrounding electrically conductive structures as integrated capacitors having a sufficiently high capacitance.

To put it another way, another aspect of the invention provides a method in which precisely those regions of the low-k back end in which grid caps are realized in a novel manner are specially treated in order thus to achieve a targeted increase in the k value and consequently the capacitance in a locally delimited region. In other words, regions having an increased k value which are localized in a well-defined manner are generated within the low-k back end in order to realize high line-to-line capacitances (e.g. grid caps) there. The rest of the low-k back end can remain unaffected by this treatment, that is to say that RC delay and crosstalk remain low.

Consequently, yet another aspect of the invention involves carrying out a local modification of the low-k material with use as inter/intrametal dielectric for increasing the dielectric constant and thus the capacitance as a passive device.

According to yet another aspect of the invention, a k value degradation is explicitly utilized and realized locally only where it is desirable in a low-k layer, namely in the region of intended grid caps. The rest of the low-k zone is preferably protected against such degradation.

By means of a surprisingly simple process engineering treatment, the capacitance of a grid cap to be produced is locally increased in a low-k environment, the treatment being realized for example using UV radiation (ultraviolet electromagnetic radiation), an RF plasma (e.g. argon sputtering $N_2O$) or an implantation of nonconductive atoms or molecules.

To summarize, various aspects of the invention achieve a targeted increase in the k value of the inter/intrametal dielectric in locally delimited regions of a low-k back end for the purpose of increasing the capacitance of passive devices.

One aspect of the invention may also be seen in performing a depth treatment of a layer made of low-k material, that is to say a treatment that goes beyond the treatment merely of a region near the surface, for the purpose of forming a component. Consequently, it is possible to form, in a targeted manner, line-to-line capacitances having an increased k value in regions of a low-k layer.

The process of subjecting the layer made of low-k material to a spatially delimited treatment may be realized for example by defining a mask or a layout in a computer-aided manner, using a control program, on the basis of which mask or layout, upon treatment with an electromagnetic beam or a material beam in regions predetermined in a defined manner, an increase in the k value in the layer made of low-k material is effected.

The electrically conductive structures may be connected up in such a way that the capacitance can be operated as an electronic component. To put it another way, the arrangement comprising a dielectric having a locally increased k value and the electrically conductive structures in a surrounding region can be operated in a defined manner as an electronic component, preferably as a capacitance.

The spatially delimited treatment for locally increasing the value of the dielectric constant in the layer made of low-k material may be realized by forming a masking layer on the layer made of low-k material and patterning the masking layer, whereby a surface region of the layer made of low-k material is uncovered, so that the region of the layer made of low-k material below the uncovered surface region forms the spatial delimitation for a subsequent treatment.

By way of example, a photoresist may be used as a mask, which photoresist is patterned using a lithography method and an etching method. Accordingly, an uncovered surface region of the layer made of low-k material is thereby made accessible to a subsequent treatment, whereas the photoresist protects other surface regions of the layer made of low-k material against a subsequent treatment.

As an alternative, the spatially delimited treatment may be realized by directing material and/or electromagnetic radiation onto the layer made of low-k material in a spatially delimited manner. A beam comprising material (electron beam, molecular beam, etc.) or electromagnetic radiation (UV radiation, etc.) with a defined diameter is directed onto the surface of the layer made of low-k material, then only the corresponding surface region of the layer made of low-k material is subjected to the spatially delimited treatment, but not other regions of the layer.

If the layer made of low-k material is subjected to the spatially delimited treatment, material of the layer made of low-k material can be modified. This means that low-k material already present is altered, for example chemically altered, so that it has an increased k value in altered form.

By way of example, the layer made of low-k material may be modified by means of irradiation with ultraviolet radiation.

As an alternative, the layer made of low-k material may be modified by means of a plasma treatment. By way of example, without a plasma treatment, porous SiCOH material has a k value of approximately 2.2. If such a material is subjected to a helium plasma treatment, then the k value increases to 2.4. At a high power, the k value of porous SiCOH is increased to 3 if an $N_2O$ plasma is used. At a low power and in the case of an $N_2O$ plasma, the k value can even be increased to greater than or equal to 6.

The layer made of low-k material may also be modified by means of implantation of atomic and/or molecular material. For this purpose, a molecular beam or an atomic beam may be directed onto the layer of the low-k material in a spatially delimited (focused) manner, with the result that a modification of the low-k material occurs in such a way that the material then has a higher k value. The implantation may also be effected over a plurality of wiring planes particularly if a capacitor is realized over a plurality of metal planes (so-called "ratio" variant during processing).

The layer made of low-k material may be modified by means of irradiation with an electron beam ("E-beam").

As an alternative to the described configurations of modifying the low-k material for the purpose of forming material having an increased k value, it is possible, if the layer made of low-k material is subjected to the spatially limited treatment, for introduction material to be introduced into the material of the layer made of low-k material. In other words, in accordance with this configuration, the existing layer made of low-k material is not altered, rather additional, external material is introduced (physically) into the layer made of low-k material. Said additional material then leads to an increase in the k value.

During the introduction, the introduction material may be effected using an atomic layer deposition method (ALD method). The atomic layer deposition method makes it possible to generate a layer having a thickness that can be predetermined very accurately, which layer can be deposited on a surface down to the accuracy of one atomic layer (that is to say down to an accuracy of a few angstroms) with a very homogeneous thickness.

Clearly, using an ALD method, materials such as, for example, silicon oxide, silicon carbide, silicon nitride can be introduced into interspaces of a porous low-k material, clearly in order to at least partly fill such interspaces.

The introduction of introduction material may be effected by forming the layer made of low-k material as a porous layer and introducing the introduction material into the pores of the layer of low-k material. This may be realized for example by impregnating a wafer having porous material in a chemical solution, atoms and/or molecules in the solution penetrating into the pores of the low-k material.

The layer made of low-k material may be formed from one or a combination of the materials SiLK, porous SiLK, oxazole, porous oxazole, black diamond, coral, nanoglass, JSR LKD, hydrogen silsesquioxane (HSQ) and methyl silsesquioxane (MSQ).

The low-k material may be realized on the basis of polymer materials. As an alternative, plasma-deposited low-k materials are possible, which may have an inorganic character.

The electrically conductive structures may be interconnects.

The layer made of low-k material and the electrically conductive structures may be formed in a wiring plane of a semiconductor chip product.

In particular, the layer made of low-k material may be realized in the BEOL (Back End Of the Line) or in the FEOL (Front End Of the Line).

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIGS. 3A, 3B show layer sequences at different points in time during a method for producing a capacitance in a layer made of low-k material in accordance with a second exemplary embodiment of the invention, and FIGS. 3A, 3C show layer sequences at different points in time during a method for producing a capacitance in a layer made of low-k material in accordance with a third exemplary embodiment of the invention;

FIGS. 4A to 4D show layer sequences at different points in time during a method for producing a capacitance in a layer made of low-k material in accordance with a fourth exemplary embodiment of the invention.

Figure 1:
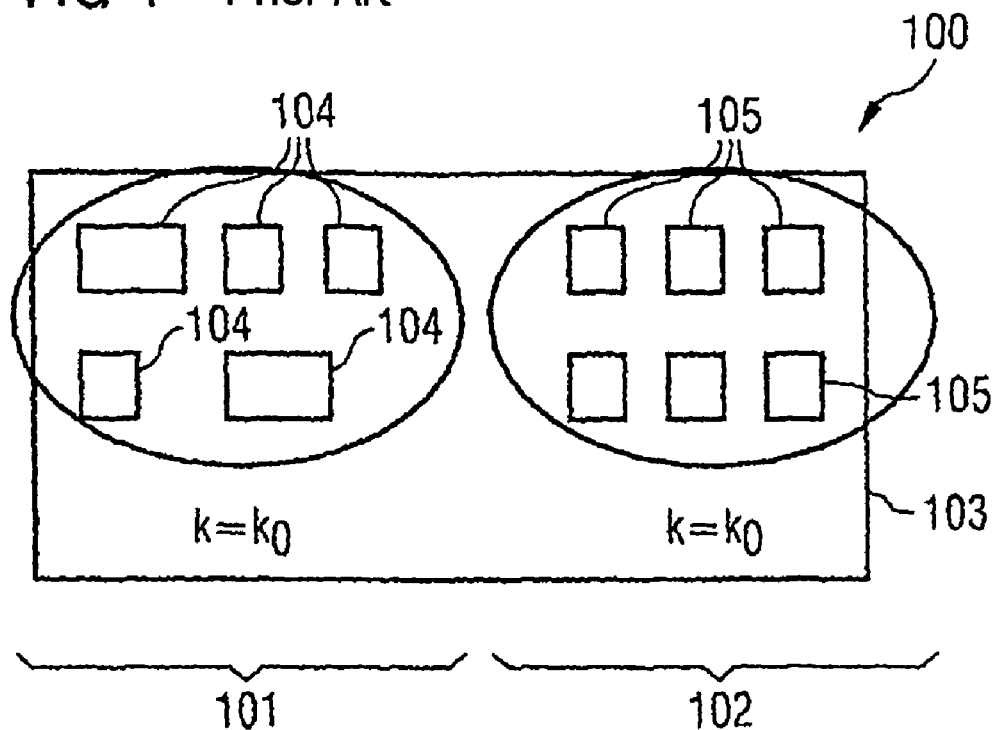
FIG. 1 shows a plan view of a semiconductor product in accordance with the prior art.

Exemplary embodiments of the embodiment are illustrated in the figures and are explained in more detail below.

Identical or similar components in different figures are provided with identical reference numerals.

The illustrations in the figures are schematic and not to scale.

DETAILED DESCRIPTION

A description is given below, referring to FIG. 2, of a plan view of a semiconductor product 200, which has been subjected to a method according to the invention for producing a capacitance in a layer made of low-k material in accordance with a first exemplary embodiment of the invention.

The semiconductor product 200 contains a product section 201 and a grid cap section 202. The product section 201 has a plurality of product components 204 embedded in a dielectric low-k layer 203. Problems with coupling capacitances and crosstalk are avoided in the region of the product section 201 on account of the low-k value $k=k_0$ in the product section 201.

The semiconductor product 200 is produced by producing on a substrate, for example made of silicon or doped silicon, in the product section 201, the logic elements required for the functionality of the semiconductor product 200, that is to say the microelectronic components, for example memory elements, transistors, diodes, nonreactive resistances, capacitances, etc., in the context of the Front End Of Line process. After Front End Of Line processing has been effected, one or a plurality of metallization planes, also referred to as wiring planes, are applied over the entire wafer, in particular over the product section and over the grid cap section 202, a low-k material being used as in the metal dielectric and copper usually used for the electrically conductive interconnects, the interconnects also being referred to hereinafter as metallization components 205.

The electrically conductive interconnects serve for electrically coupling in particular the microelectronic components formed in the product section 201 to external connections of a chip that is respectively to be fabricated.

In a grid cap section 202, a plurality of metallization components 205 made of copper are embedded in a region of the dielectric layer having a locally increased k value 206 ($k>k_0$). As shown in FIG. 2, the dielectric low-k value 203 has a k value of $k=k_0$, whereas the k value in the region 206 is increased, that is to say $k>k_0$. Consequently, the coupling capacitances between metallization components 205, in accordance with equation (1), are high on account of the high k value (or $\in$ value) so that the crossover regions between metallization components 205 and the material of the region having a locally increased k value 206 are realized as grid caps.

Figure 2:
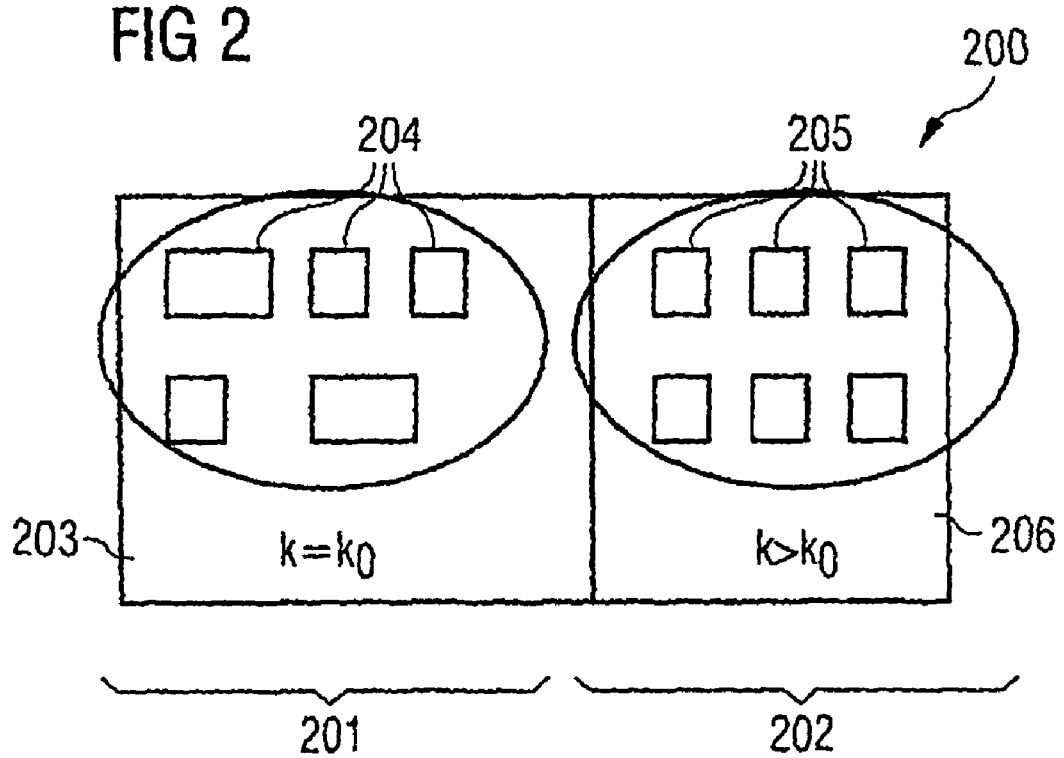
FIG. 2 shows a plan view of a semiconductor product in accordance with a first exemplary embodiment of the invention.

Proceeding from the semiconductor product in accordance with the prior art as shown in FIG. 1, it is possible to produce the semiconductor product 200 according to the invention as shown in FIG. 2 by covering only the product section 201 with a protective photoresist, but not the grid cap section 202. After a corresponding treatment with a plasma beam, only the material of the dielectric low-k layer 203 in the grid cap section 202 is modified in such a way that the k value is thereby increased, whereas on account of the photoresist material on the product section 201, the latter is protected against an increase in the k value, this increase being undesirable in this section.

A description is given below, referring to FIG. 3A, FIG. 3B, of a method for producing a capacitance in a layer made of low-k material in accordance with a second exemplary embodiment of the invention.

FIG. 3A shows a cross-sectional view of a layer sequence 300, in which a low-k layer 301 having a low k value $k=k_0$ is formed on a substrate 302. The actual semiconductor product is formed in the substrate 302 by means of process techniques appertaining to semiconductor microelectronics. The low-k layer 301 belongs to the end-of-the-line region of a semiconductor product.

In order to obtain the layer sequence 310 shown in FIG. 3B, a defined surface region of the low-k layer 301 is modified using a local plasma 313, that is to say a spatially delimited plasma beam, so that a region having an increased k value 312 is formed between low-k regions 311. The layer sequence 310 shown in FIG. 3B thus contains a locally defined region 312 having an increased k value, in which grid capacitances are formed from the material having an increased k value and metallization lines not shown in FIG. 3B. By contrast, the value of the RC delay is kept down in the low-k regions 311 since the k value is small in this region. Consequently, the parasitic coupling capacitances are small in these regions. The production method described with reference to FIG. 3A, FIG. 3B avoids a separate mask for defining the spatially delimited region containing material having an increased k value.

FIG. 3C shows a layer sequence 320, which is produced proceeding from the layer sequence 300 shown in FIG. 3A in accordance with a method for producing a capacitance in a layer made of low-k material in accordance with a third exemplary embodiment of the invention.

In order to attain the layer sequence 320 shown in FIG. 3C proceeding from the layer sequence 300 shown in FIG. 3A, the low-k layer 301 is covered with a layer made of photoresist and the photoresist is patterned using a lithography method and an etching method to form a mask 321. Afterward, a plasma 322 is directed onto the entire area of the surface of the layer sequence partly covered with the mask 321, as a result of which a region having an increased k value is formed in uncovered surface regions of the layer sequence. By contrast, the surface regions of the low-k layer 301 that are covered with the mask 321 remain unchanged, as a result of which low-k regions 311 remain. After this treatment, the mask 321 can be removed, for example by means of stripping (not shown).

A description is given below, referring to FIG. 4A to FIG. 4D, of a method for producing a capacitance in a layer made of low-k material in accordance with a fourth exemplary embodiment of the invention.

In order to obtain the layer sequence 400 shown in a cross-sectional view in FIG. 4A, first and second interconnects 402, 403 made of copper or aluminum are formed in a low-k layer 401 made of porous SiLK™. This may be carried out for example using a damascene method, or by means of progressively forming the low-k layer 401 and respectively the metallization components 402, 403 using deposition, lithography and etching methods. The first interconnect 402 runs perpendicular to the paper plane of FIG. 4A.

As can be discerned from the enlargement 405 of a partial region of the low-k layer 401, the material of the low-k layer 401 is porous, that is to say has pores 404.

In order to obtain the layer sequence 410 shown in FIG. 4B, a photoresist layer is deposited on the surface of the layer sequence 400 and patterned using a lithography method and an etching method, as a result of which a mask 411 is formed.

In order to obtain the layer sequence 420 shown in FIG. 4C, the layer sequence 410 partly covered with the mask 411 is subjected to an ALD method, an ALD material beam 421 being directed onto the surface of the layer sequence 410. This material, for example silicon oxide or silicon nitride, penetrates into the low-k layer 401, partly fills the pores 404 contained therein and thus generates regions having an increased k value 423 in the low-k layer 401. Such surface regions of the low-k layer 401, by contrast, which are covered with the mask 411 remain free of influencing by the ALD method and thus form low-k regions 422.

In order to obtain the layer sequence 430 shown in FIG. 4D, the photoresist mask 411 is removed from the surface of the layer sequence 420.

As shown in the enlargement 431, on account of the treatment of the layer sequence 420 by means of the ALD method, an ALD layer 432 having an increased k value relative to the pores 404 of the porous SiLK is in each case formed in the pores 404, with the result that regions 423 having an increased k value are provided.

Consequently, a capacitance is provided in a crossover region 433 of the first interconnect 402 and the second interconnect 403 with the region having an increased k value 423 situated in between, said capacitance having a sufficiently high value of the dielectric constant, cf. (1).

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

We claim:
1. A method for producing a semiconductor product,
   forming semiconductor product components in a semiconductor product region of a substrate;
   forming a layer made of low-k material subsequently on the substrate;
   forming electrically conductive interconnects in or on the layer made of low-k material for the purpose of electrically connecting the semiconductor product components, the layer being provided in a wiring plane of the semiconductor product for the electrical insulation of the interconnects from one another;

subjecting the layer made of low-k material to a spatially delimited treatment, within a grid cap region of the substrate, situated outside the semiconductor product region, and further within at least one crossover region of the interconnect, such that a dielectric constant value of the layer is increased in the crossover region, whereby an interconnect-to-interconnect capacitance is formed as a grid cap capacitance from the interconnects arranged in the crossover region;

wherein the dielectric constant of the low-k material remains unchanged in the semiconductor product region.

2. The method as claimed in claim 1,
wherein the electrically conductive structures are connected in such a way that the capacitance can be operated as an electronic component.

3. The method as claimed in claim 1,
wherein the spatially delimited treatment is realized by,
forming a masking layer on the layer made of low-k material;
patterning the masking layer, whereby a surface region of the layer made of low-k material is uncovered, so that the region of the layer made of low-k material below the uncovered surface region forms the spatial delimitation for a subsequent treatment.

4. The method as claimed in claim 1,
wherein the spatially delimited treatment is realized by directing material or electromagnetic radiation onto the layer made of low-k material in a spatially delimited manner.

5. The method as claimed in claim 1,
wherein, while the layer made of low-k material is being subjected to the spatially delimited treatment, material of the layer made of low-k material is modified.

6. The method as claimed in claim 5,
wherein the layer made of low-k material is modified by means of irradiation with ultraviolet radiation.

7. The method as claimed in claim 5,
wherein the layer made of low-k material is modified by means of a plasma treatment.

8. The method as claimed in claim 5,
wherein the layer made of low-k material is modified by means of implantation of atomic or molecular material.

9. The method as claimed in claim 5,
wherein the layer made of low-k material is modified by means or irradiation with an electron beam.

10. The method as claimed in claim 1,
wherein, while the layer made of low-k material is being subjected to the spatially delimited treatment, introduction material is introduced into the layer made of low-k material.

11. The method as claimed in claim 10,
wherein the introduction material is introduced into the layer made of low-k material using an atomic layer deposition method.

12. The method as claimed in claim 11,
wherein the introduction material is introduced into the layer made of low-k material by,
forming the layer made of low-k material as a porous layer;
introducing the introduction material into the pores of the layer made of low-k material.

13. The method as claimed in claim 1,
wherein the layer made of low-k material is formed from one or a combination of the materials of a group including, SiLK, porous SiLK, oxazole, porous oxazole, black diamond, coral, nanoglass, JSR LKD, hydrogen silsesquioxane, and methyl silsesquioxane.

14. The method as claimed in claim 1,
wherein the spatially delimited treatment is realized by directing material and electromagnetic radiation onto the layer made of low-k material in a spatially delimited manner.

15. a semiconductor product comprising:
a substrate;
semiconductor product components formed in a semiconductor product region of the substrate;
a layer made of low-k material formed on the substrate;
electrically conductive interconnects formed in or on the layer made of low-k material for the purpose of electrically connecting the semiconductor product components, the layer being provided in a wiring plane of the semiconductor product for the electrical insulation of the interconnects from one another;
wherein the layer made of low-k material to has a spatially delimited region, within a grid cap region of the substrate, situated outside the semiconductor product region, and further within at least one crossover region of the interconnect, such that a dielectric constant value of the layer is increased in the crossover region, whereby an interconnect-to-interconnect capacitance is formed as a grid cap capacitance from the interconnects arranged in the crossover region;
wherein the dielectric constant of the low-k material remains unchanged in the semiconductor product region.

* * * * *